(12) United States Patent
Kaczynski (10) Patent No.: US 8,102,216 B1
(45) Date of Patent: Jan. 24, 2012

(54) VOLTAGE CONTROLLED OSCILLATOR HAVING REDUCED PHASE NOISE

(75) Inventor: Brian Kaczynski, Cracow (PL)

(73) Assignee: Qualcomm Atheros, Inc., San Jose, CA (US)

( * ) Notice: Subject to any disclaimer, the term of this patent is extended or adjusted under 35 U.S.C. 154(b) by 83 days.

(21) Appl. No.: 12/436,516

(22) Filed: May 6, 2009

(51) Int. Cl.
*H03B 5/12* (2006.01)

(52) U.S. Cl. ............................. 331/117 FE; 331/117 R (58) Field of Classification Search ............ 331/117 FE, 331/117 R, 167
See application file for complete search history.

(56) References Cited

U.S. PATENT DOCUMENTS

| | | | | |
|---|---|---|---|---|
| 3,328,720 A * | 6/1967 | Arntsen | ........................... | 331/59 |
| 4,574,257 A * | 3/1986 | Kasperkovitz et al. | ... | 331/116 R |
| 5,734,285 A * | 3/1998 | Harvey | .......................... | 327/291 |
| 7,193,484 B2 * | 3/2007 | Maeda | ...................... | 331/117 R |
| 7,323,947 B2 * | 1/2008 | Shigematsu | .............. | 331/177 V |
| 2006/0097811 A1 * | 5/2006 | Nakamura et al. | ............. | 331/167 |
| 2009/0072920 A1 * | 3/2009 | Wachi et al. | ............. | 331/117 R |
| 2009/0184774 A1 * | 7/2009 | Deng et al. | .............. | 331/117 FE |

* cited by examiner

*Primary Examiner* — Levi Gannon
(74) *Attorney, Agent, or Firm* — DeLizio Gilliam, PLLC (57) ABSTRACT

A VCO comprises an LC tank circuit coupled to a plurality of cross-coupled transistor devices. A first resonance frequency of a waveform output of the VCO is dependent upon the values of a first capacitor and a first inductor of the LC tank. The VCO further comprises a first series LC resonator comprising a second capacitor and a second inductor in parallel to the first capacitor and the first inductor. The values of the second capacitor and second inductor are selected to produce a second resonance frequency that is a third harmonic of the first resonance frequency, thereby increasing a slope of the voltage controlled oscillator output. The increased slope reduces phase noise, which leads to improved signal-to-noise ratio.

19 Claims, 9 Drawing Sheets

VOLTAGE CONTROLLED OSCILLATOR HAVING REDUCED PHASE NOISE

BACKGROUND

1. Field of the Invention

Embodiments of the present invention generally relate to a voltage controlled oscillator having reduced phase noise.

2. Description of the Related Art

A voltage controlled oscillator (VCO) is an electronic circuit that is used to generate an electrical signal that oscillates at a frequency which is controlled by an input voltage. In other words, the input voltage to the VCO sets the frequency of the oscillating VCO output signal. As the input voltage is varied, the VCO's output signal frequency changes in accordance to well-known equations. This VCO voltage-frequency relationship is critical for many different communication applications. Consequently, one or more VCOs are found in virtually every modern communication device, such as in cell phones, radio transmitters and receivers, satellite receivers, GPS systems, wireless data systems, etc.

Figure 1:
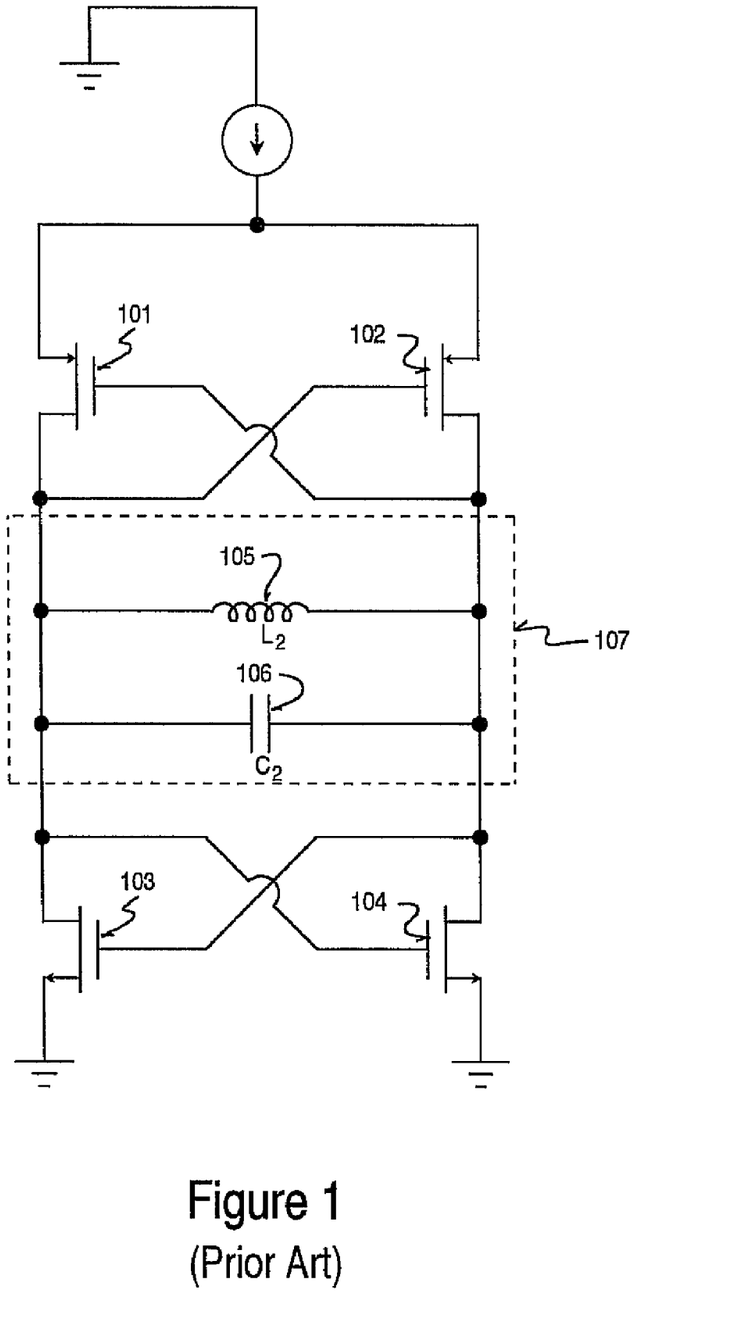
FIG. 1 shows a circuit diagram of a typical prior art voltage controlled oscillator.
Figure 2:
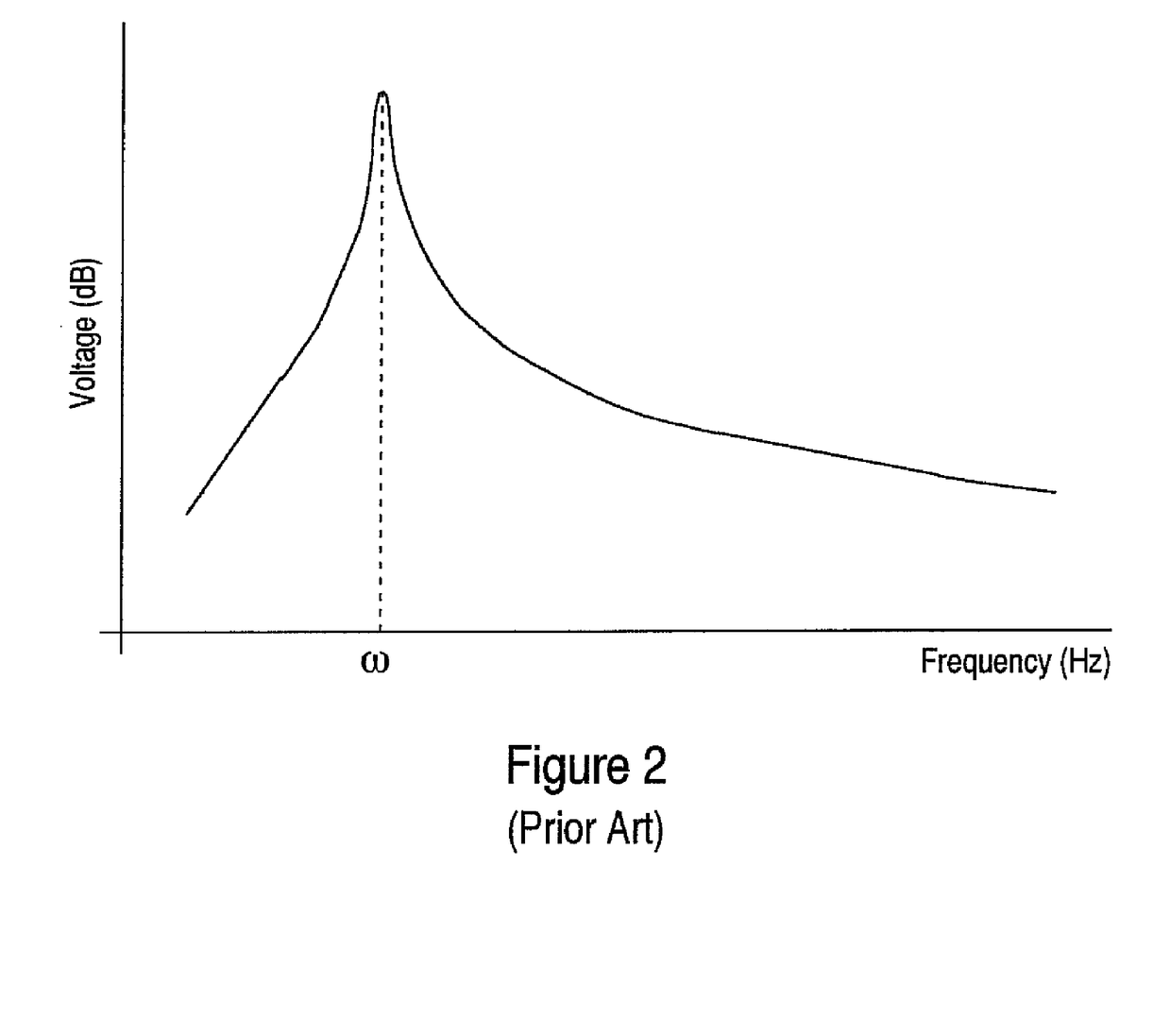
FIG. 2 is a plot depicting the AC analysis results of a typical prior art second-order LC tank circuit.
Figure 3:
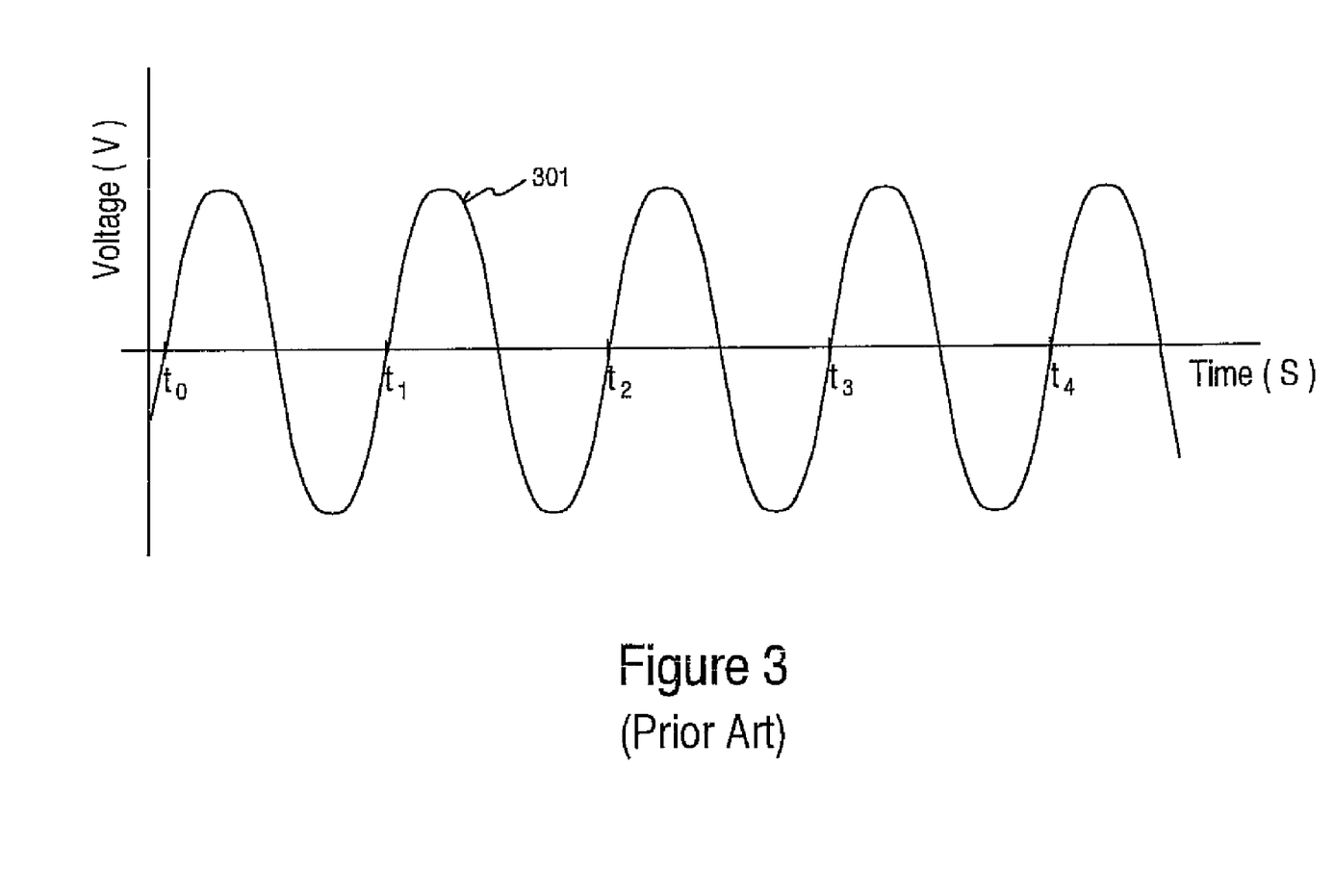
FIG. 3 shows an oscillating, sinusoidal waveform of a typical prior art VCO output signal.

FIG. 1 shows a circuit diagram of a typical VCO. The VCO includes four transistors 101-104, an inductor 105, and a capacitor 106. The inductor 105 in parallel with capacitor 106, forms a classic resonant or tuned circuit, also commonly referred to as an LC "tank" circuit 107. More particularly, the LC tank circuit 107 is defined as a second-order circuit because its voltage or current can be described by a second-order differential equation. FIG. 2 is a plot depicting the AC analysis results of a second-order LC tank circuit that may be stimulated by a unit current source. It can be seen that the second-order LC tank circuit has a single resonant frequency, w, which is referred to as being a first or "fundamental" harmonic. This second-order LC tank circuit is used in conjunction with the four cross-coupled transistors 101-104, to generate an oscillating, sinusoidal waveform as shown in FIG. 3. The oscillating, sinusoidal waveform 301, output from the VCO, serves as a reliable, constant reference signal that other circuits rely upon to perform their respective functions.

Ideally, the VCO output signal should have perfect periodicity. This is characterized by each cycle of the sinusoidal waveform having the same period or duration as all the other cycles. For example, referring to waveform 301 of FIG. 3, $t_0$-$t_1$ should be the same time as $t_1$-$t_2$; $t_1$-$t_2$ should be the same time as $t_2$-$t_3$; and $t_2$-$t_3$ should be the same time as $t_3$-$t_4$; etc., ($t_0$-$t_n$ represent the zero-crossings where the signal crosses a reference voltage). Unfortunately, noise is always present and poses a serious problem to any circuit design. Unavoidably, the transistors and other elements may introduce a rather significant amount of noise as part of the VCO functionality. The undesired effect is that individual zero-crossings can deviate from the ideal condition (e.g., the zero crossings may sometimes occur earlier, while at other times, they may occur later than expected). The changes in the times when the VCO waveform crosses the reference voltage, is referred to as jitter. In terms of frequency, the deviations result in variable changes to the VCO's frequency during its normal course of operation. The changes in frequency is commonly referred to as phase noise.

Phase noise is highly undesirable because it detrimentally impacts the overall performance of the system. A standard measurement of the performance of a system is its signal-to-noise ratio. The signal-to-noise ratio is defined as the ratio of a signal power to the noise power corrupting the signal. Consequently, the phase noise attributed to the VCO directly reduces the system's signal-to-noise ratio. In real terms, a lower signal-to-noise ratio translates into degraded signal quality and/or shorter range of coverage. Thus, it is an important design criteria to reduce or minimize the phase noise inherent to VCO circuits in order to attain a high degree of signal-to-noise ratio (SNR).

One way to potentially reduce a VCO's phase noise entails adding additional circuitry with active components to somehow cancel or compensate for the phase noise. However, this solution consumes additional power. For portable applications (e.g., cell phones), this approach may impose further drains upon battery life. Furthermore, the additional circuitry adds to the cost of production and may only ameliorate the phase noise by a relatively small margin.

Presently, designers are faced with accommodating the phase noise associated with VCOs and the attendant lower signal-to-noise ratio versus trading off cost/power in terms of adding circuitry to achieve a lower degree of VCO phase noise.

SUMMARY

This Summary is provided to introduce a selection of concepts in a simplified form that are further described below in the Detailed Description. This Summary is not intended to identify key features or essential features of the claimed subject matter nor is it intended to be used to limit the scope of the claimed subject matter.

Embodiments of the present disclosure pertain to an electronic voltage controlled oscillator. The voltage controlled oscillator has a resonant circuit that causes the output waveform from the voltage controlled oscillator to take on a more squared up shape as compared to that of a conventional sinusoidal waveform. The squared up waveform has a greater slope. Due to this greater slope, active devices spend less time transitioning through the vulnerable zero-crossing points. Consequently, less phase noise occurs during the zero-crossing points. In turn, devices which utilize the present VCO embodiments will have improved signal-to-noise ratios for overall performance gains.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

The present invention pertains to an efficient, cost-effective way by which VCO phase noise is reduced or otherwise minimized across a wide frequency spectrum. This is accomplished by more tightly controlling when zero-crossings can occur. Zero crossings are of particular concern because the active devices (e.g., the transistors) are in balance and are at the verge of switching (e.g., transitioning from conducting to non-conducting or vice versa). It is at this point, whereby the transistors are highly susceptible to introducing phase noise. By more narrowly limiting the times at which the zero crossings can occur, it essentially tightens the tolerances. One way to narrow the window for zero crossings, is to increase the rising and falling slopes of the oscillating VCO output signal. A steeper slope directly translates into less time being spent in the problematic, noisy zero-crossing zone. In turn, this reduces the amount by which the zero-crossings can deviate from their ideal zero-crossing points. The result is a reduction in the VCO phase noise. This approach has been demonstrated to reduce the phase noise by a fair amount (e.g., on an order of magnitude of approximately 3 dB) and works remarkably well across a relatively wide frequency spectrum (e.g., 100 kHz to 10 MHz).

There exist many different embodiments for implementing the present invention. Basically, any embodiment that "flattens" the tops and bottoms of the output waveform while it "steepens" the sides of the output waveform, will accomplish the desired reduction in the VCO phase noise. In general, embodiments of the present invention transform the VCO output waveform to more resemble a square wave shape in contrast to the standard sinusoidal shape. This can be accomplished by a wide variety of different combinations of active devices (e.g., transistors) and/or passive devices (e.g., resistors, inductors, and capacitors).

Figure 4:
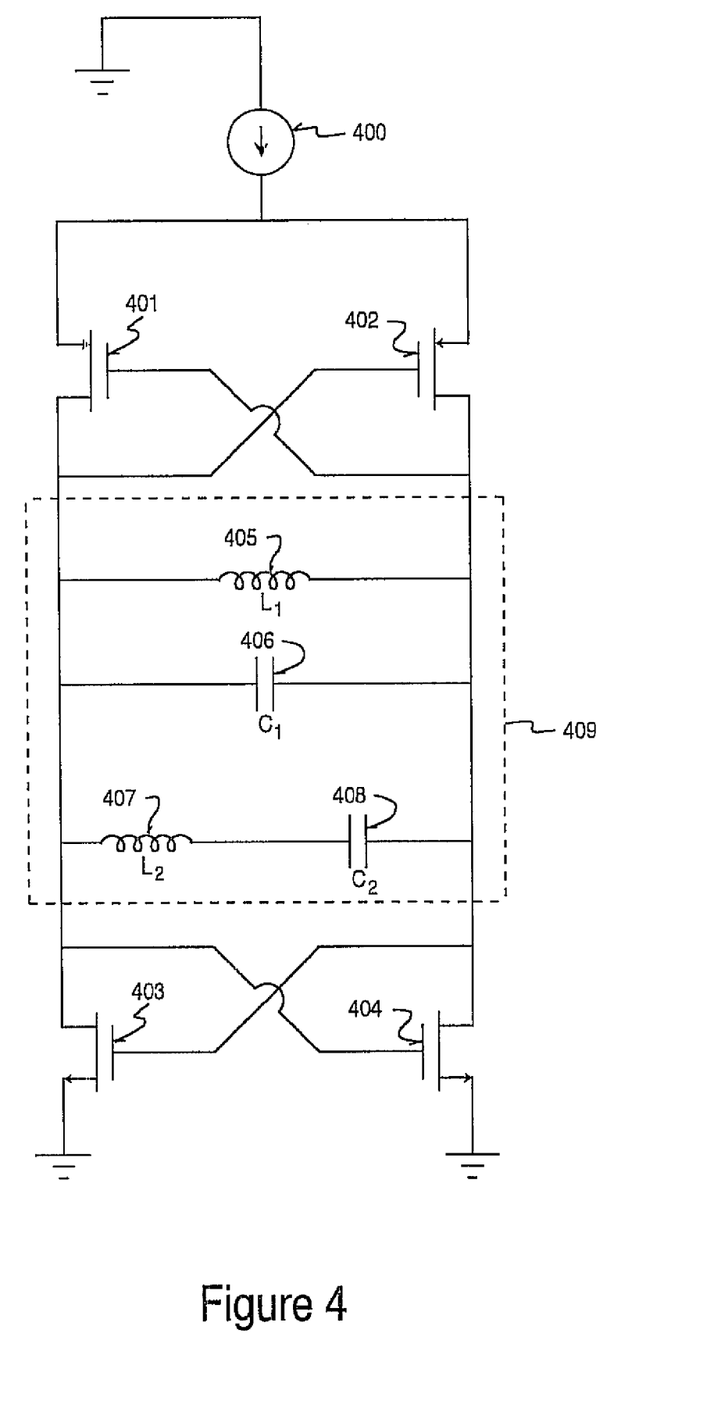
FIG. 4 shows one embodiment of a VCO circuit design having a fourth-order tank circuit.

One embodiment for increasing the slope of the VCO output signal to reduce phase noise, entails implementing a tank circuit that utilizes higher-order resonators, e.g., greater than the traditional second-order resonator. For example, a fourth-order resonator adds a resonance at the third harmonic. This "squares up" the waveform, resulting in less time spent in the noisy transition zone and ultimately reduces the VCO phase noise. FIG. 4 shows one embodiment of a VCO with a fourth-order tank circuit. The VCO is comprised of a current source 400, four transistors 401-404, and a fourth-order tank circuit 409. Transistors 401-402 are P-channel MOSFET transistors, and transistors 403-404 are N-channel MOSFET transistors. Transistors 401 and 403 form a first inverter. Transistors 402 and 404 form a second inverter. The two inverters are cross-coupled, whereby the output of the first inverter is coupled to the input of the second inverter, and output of the second inverter is coupled to the input of the first inverter. The fourth-order tank circuit 409 is coupled between the upper pair of P-channel MOSFET transistors 401-402 and the lower pair of N-channel MOSFET transistors 403-404.

The fourth-order tank circuit 409 is comprised of inductor 405, capacitor 406, inductor 407, and capacitor 408. Inductor 405 is coupled in parallel with capacitor 406 and also in parallel with the series combination of inductor 407 and capacitor 408. This fourth-order tank circuit layout results in a multi-frequency resonator. More particularly, the inductor 407 in series with capacitor 408, is equivalent to a capacitor at a lower resonant frequency, $\omega_l$, and it is equivalent to an inductor at a higher resonant frequency, $\omega_h$. Note that the fourth-order tank circuit 409 has a zero at the resonant frequency of inductor 407 and capacitor 408. This grants an extra degree of freedom; this notch can be placed as desired anywhere between $\omega_l$ and $\omega_h$. However, due to practical considerations, the notch is placed generally closer to $\omega_h$, so as not to de-Q the tank circuit too much at the fundamental.

The design equations for a fourth-order LC tank circuit are disclosed as follows. Given that the following are known:
$L_1$=primary tank inductance
$\omega_l$=fundamental frequency
$\omega_n$=notch frequency (note that $\omega_l < \omega_n < 3\omega_l$),
Define "x" such that $0 < x < 1$ and $\omega_n = (\omega_l)^{1-x}(3\omega_l)^x = 3^x \omega_l$.
This results in the following:

$$C_1 = (1/9)^{1-x}/(\omega_l^2 L_1)$$

$$L_2 = L_1/[(1-(1/9)^{1-x})(9^x-1)]$$

$$C_2 = [(1-(1/9)^{1-x})(1-(1/9)^x)]/(\omega_l^2 L_1).$$

A convenient choice for "x" is $x = \log_9 5 \approx 0.7325$ because this is the value that minimizes $L_2$. This produces the following simplifications:

$$C_1 = (5/9)/(\omega_l^2 L_1), L_2 = (9/16)L_1, \text{ and } C_2 = (16/45)/(\omega_l^2 L_1).$$

Thereby, the above equations provide a detailed process for selecting $C_1$, $L_1$, $C_2$, and $L_2$ such that a peaked third harmonic is effectively added.

Figure 5:
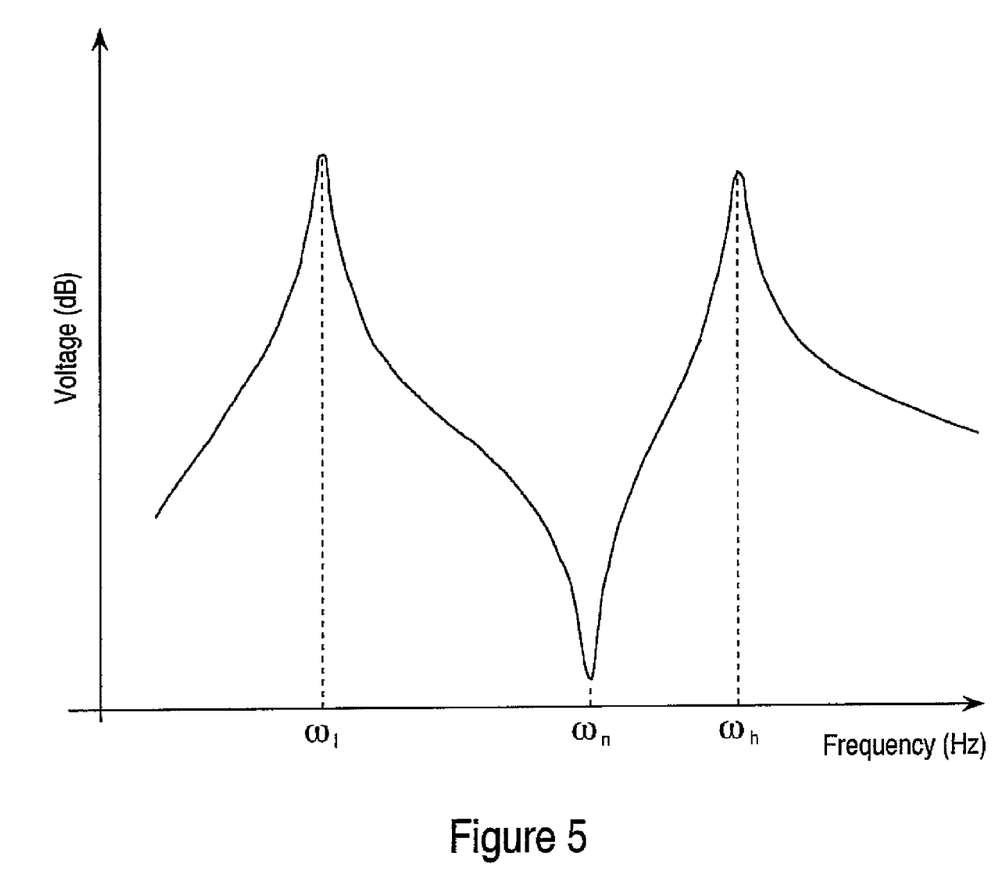
FIG. 5 is a plot depicting the AC analysis results of a fourth-order LC tank circuit.

FIG. 5 is a plot depicting the AC analysis results of a fourth-order LC tank circuit, which shows the added resonance at the third harmonic. In one embodiment, $\omega_l$=5.0 GHz, $w_n$=12 GHz, and $\omega_h$=15 GHz. By adding a resonance at the third harmonic (e.g., $\omega_h$ is three times $\omega_l$), this squares up the output signal because square waves are characterized by odd harmonics (e.g., fundamental, third, fifth, seventh, etc.).

Figure 6:
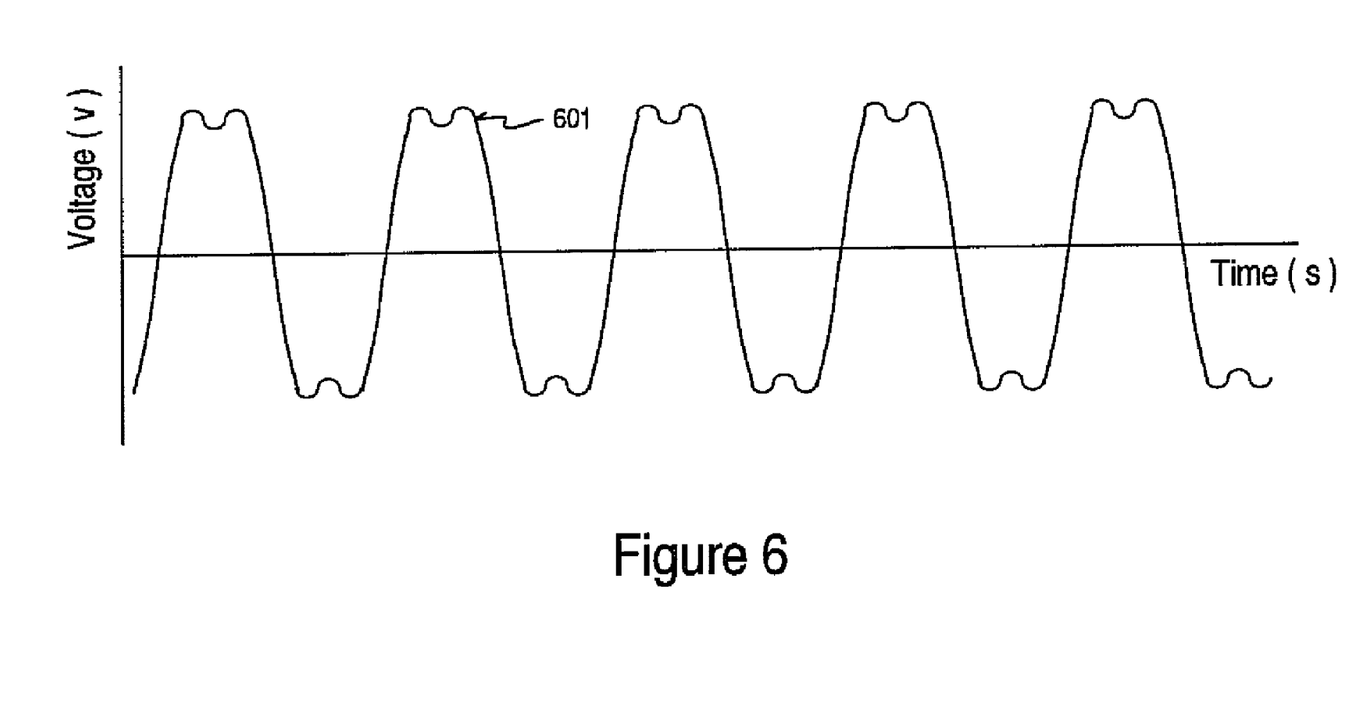
FIG. 6 shows a squared up oscillating signal output by a VCO having a fourth-order LC tank circuit.

FIG. 6 shows a squared up oscillating signal output by a VCO having a fourth-order LC tank circuit. The oscillating, squared up VCO output signal 601 has a greater slope than that of a traditional sinusoidal signal. The squared up signal 601 has a greater positive slope on rising edges and also a greater negative slope on falling edges as compared to a traditional sinusoidal signal. This greater slope means that less time is spent transitioning between the peak and troughs of the signal. Of particular relevance, less time is spent at the zero crossing points. Consequently, the amount of time that the devices (e.g., transistors) spend transitioning near or at the zero crossings is reduced, thereby reducing the time by which phase noise is introduced. A reduction in phase noise is highly desirable because it leads directly to an improved signal-to-noise ratio. In other words, the signal is clearer and stronger.

In other embodiments, the VCO output signal can be squared up even more by adding additional resonances at odd harmonics. As described above, square waves are characterized by odd harmonics. Consequently, sixth-, eighth-, tenth-, etc. order tank circuits can be utilized to produce fifth, seventh, ninth, etc. harmonics. With the addition of each successive odd harmonic, the resultant output waveform approaches becoming more and more like a square wave. In other words, the slopes are increased with the addition of more odd harmonics. As the VCO output signal approaches the shape of a square wave, its phase noise is reduced, which means that the system's signal-to-noise ratio improves.

Figure 7:
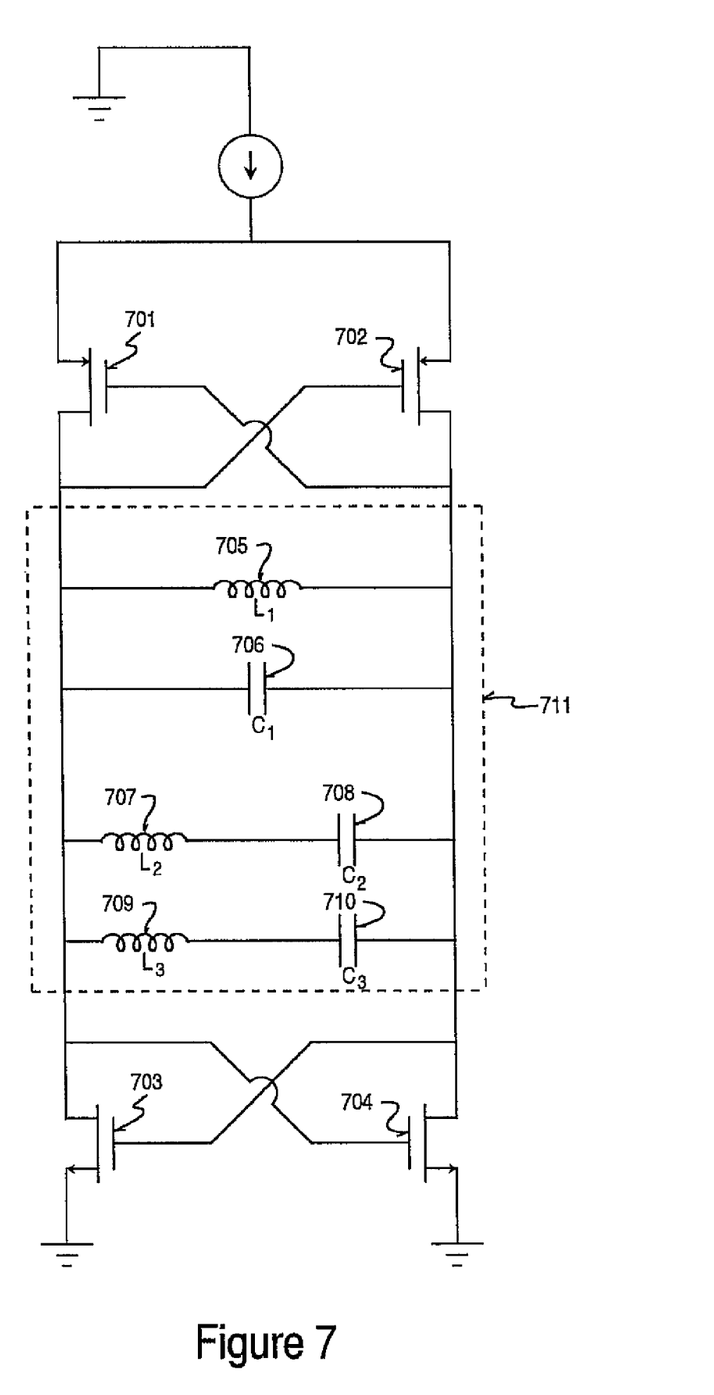
FIG. 7 shows an embodiment of a VCO circuit having a sixth-order tank circuit.

FIG. 7 shows an embodiment of a VCO circuit having a sixth-order tank circuit. The VCO is comprised of four cross-coupled transistors 701-704 and an LC tank circuit 711. The LC tank circuit 711 is a sixth-order tank circuit has three resonances, one resonance at each of the first, third, and fifth harmonics. The LC tank circuit 711 is comprised of inductors 705, 707, and 709 and capacitors 706, 708, and 710. More particularly, inductor 705 is in parallel with capacitor 706; inductor 707 is in series with capacitor 708; and inductor 709 is in series with capacitor 710. In addition, the series connection of inductor 707 and capacitor 708 is in parallel with inductor 705 and capacitor 706. Likewise, the series connection of inductor 709 and capacitor 710 is in parallel with inductor 705, capacitor 706, and the series connection of inductor 707 and capacitor 708. The combination of inductors 705 and 707 with capacitors 706 and 708 is equivalent to that of a fourth-order tank circuit as described above. The addition of the combination of inductor 709 and capacitor 710 adds a third resonance at the fifth harmonic. This produces a more squared up VCO output signal. In other embodiments (not shown in the Figures), additional LC elements can be added in an LC ladder configuration to produce even more squared up VCO output signals.

Typically, the VCO is part of a larger circuit design. A semiconductor chip can contain one or more buffers, mixers, VCOs, amplifiers, etc. Hence, a portion of the silicon wafer of a semiconductor chip is used to fabricate the VCO. It is highly advantageous to keep the VCO layout as small as possible in order to consume less of the valuable silicon die area. A smaller silicon die area for the VCO means that the silicon can be used to fabricate other circuitry, thereby minimizing fabrication costs. The VCO with the higher order tank circuit described above can assume many different circuit layout designs. In one embodiment, the additional inductor can be fabricated from hitherto unused silicon area. In other words, silicon area that was unused can be reclaimed and used now to fabricate an inductor.

Figure 8:
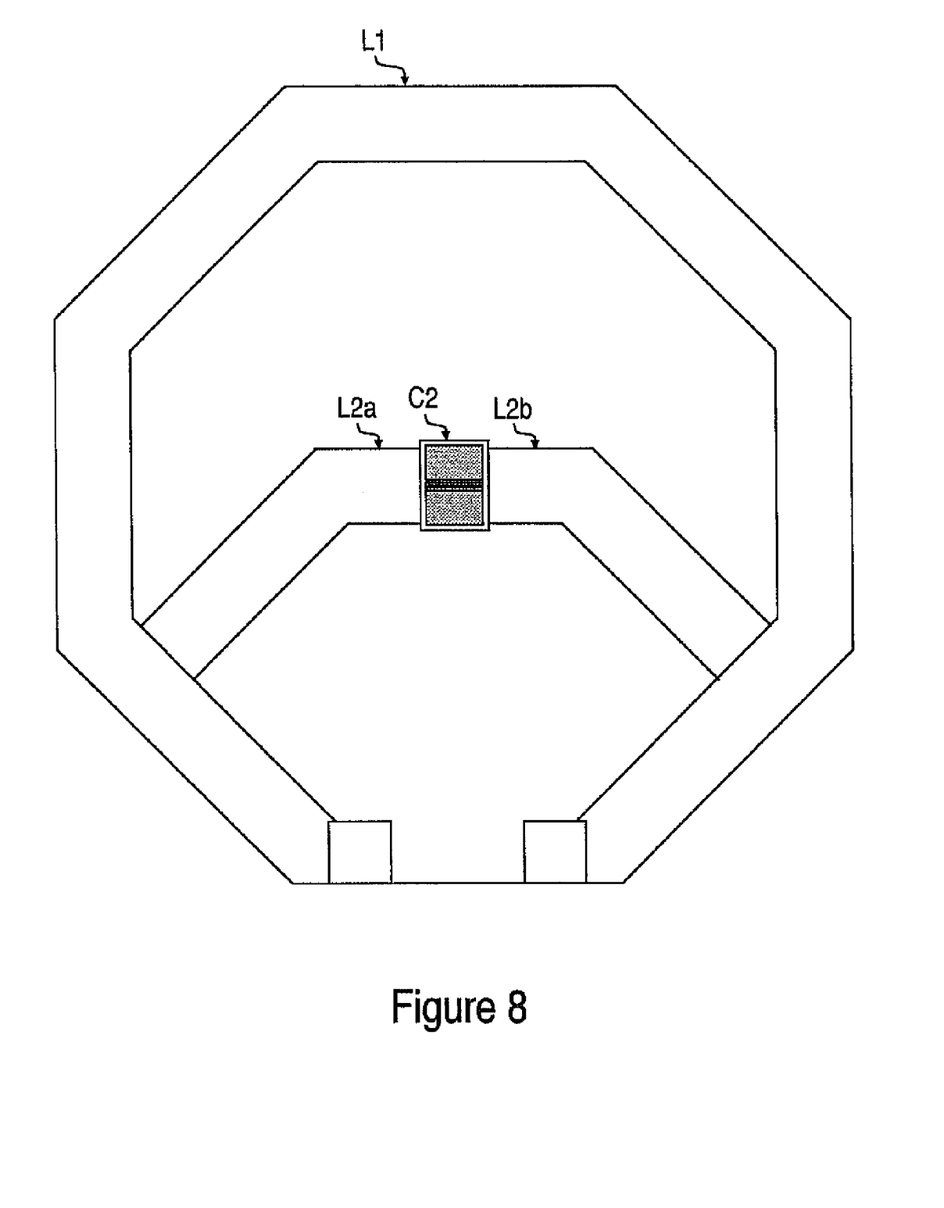
FIG. 8 shows an embodiment of a semiconductor circuit layout for a VCO having a fourth-order tank circuit, whereby the silicon area encompassed within the boundary of an metal line comprising one inductor can be reclaimed and used to fabricate a second inductor.

FIG. 8 shows an embodiment of a semiconductor circuit layout for a VCO having a fourth-order tank circuit, whereby the silicon area encompassed within the boundary of an metal line comprising one inductor can be reclaimed and used to fabricate a second inductor. For example, the ring portrayed in the shape of a semi-octagon is comprised of a metal line that overlays the semiconductor substrate/layer(s). This semi-octagon metal line is used to fabricate an inductor (e.g., $L_1$). A separate, dedicated capacitor, $C_1$, is not shown in the drawings because the capacitance inherent with buffers, mixers, and/or amplifiers normally associated with tuned LC tank circuits can be used to provide the $C_1$ capacitance. The $C_2$ capacitor is fabricated as an interdigitated-finger capacitor and is placed at the proximate center of the semi-octagon $L_1$ metal line. The $L_2$ capacitor is fabricated as two metal lines, $L_2a$ and $L_2b$. The $L_2a$ metal line extends from one side of the $C_2$ capacitor to the $L_1$ metal line. The $L_2b$ metal line extends from the other side of the $C_2$ capacitor the $L_1$ metal line. The $L_2a$ and $L_2b$ metal lines use the silicon die area within the semi-octagon $L_1$ line, which traditionally was left unused. Thereby, $C_2$ and $L_2$ can be fabricated without increasing the size of the silicon die area. In other words, adding an additional resonance to square up the VCO output signal can be accomplished with very little cost. Furthermore, because the tank circuit is comprised of passive LC elements, the amount of additional power consumed is negligible. In short, embodiments of the present invention reduce undesirable phase noise with minimal impact to cost and power consumption.

Figure 9:
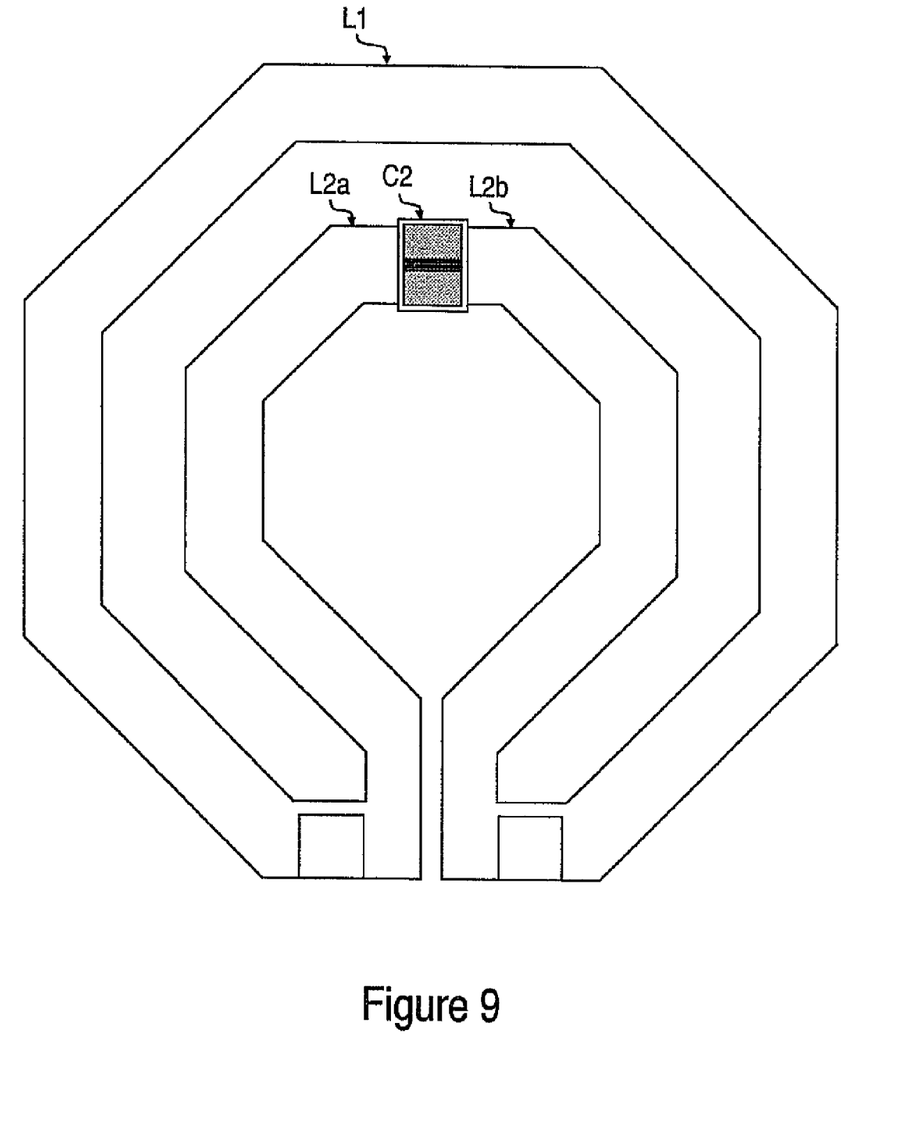
FIG. 9 shows yet an embodiment of a semiconductor circuit layout for a VCO having a fourth-order tank circuit, wherein the inductors are metal lines laid out as two concentric rings.

FIG. 9 shows yet another embodiment of a semiconductor circuit layout for a VCO having a fourth-order tank circuit. This embodiment differs from the semiconductor layout of FIG. 8 in that the $L_1$ and $L_2$ inductors are fabricated as two concentric rings. More particularly, the metal line forming $L_2$ is a concentric inner ring that resides within the boundary defined by the outer ring of the metal line forming $L_1$. The lengths of the metal lines are made to match the values of the inductors. In other embodiments, the inductors can have different configurations, such as but not limited to multiple loops, turns, spirals, etc. It should be noted that the embodiments shown in FIGS. 8 and 9 are not limited to VCO's, but have applications in any circuits that utilize at least two inductors in parallel.

A VCO having reduced phase noise has now been disclosed. Although illustrative embodiments of the invention have been described in detail herein with reference to the accompanying figures, it is to be understood that the invention is not limited to those precise embodiment. Furthermore, embodiments of the invention are applicable to virtually any electronic oscillator design, including, but not limited to variable frequency oscillators, digital VCOs, digitally-controlled oscillators, voltage-controlled crystal oscillators, etc. Moreover, embodiments of the invention encompasses any manner of resonant circuits and are not limited to LC tank circuits. In addition, other components (e.g., diodes) can be used as well as having additional transistors. The embodiments described above are not intended to be exhaustive or to limit the invention to the precise forms disclosed. As such, many modifications and variations will be apparent. Accordingly, it is intended that the scope of the invention be defined by the following Claims and their equivalents.

What is claimed is:

1. A voltage controlled oscillator comprising:
   a plurality of transistors; and
   a tank circuit coupled to the plurality of transistors, wherein the tank circuit has a first resonance at a first harmonic and a second resonance at a third harmonic for minimizing phase noise,
   and wherein the tank circuit is comprised of a first inductor coupled in parallel with a first capacitor and in parallel with a second inductor in series with a second capacitor and in parallel with a third inductor in series with a third capacitor wherein said first inductor, said first capacitor, said second inductor in series with said second capacitor and said third inductor in series with said third capacitor share first and second nodes.

2. The voltage controlled oscillator of claim 1, wherein the tank circuit is comprised of a fourth-order resonator circuit.

3. The voltage controlled oscillator of claim 1, wherein an output signal from the voltage controlled oscillator is more squared than a sinusoidal waveform.

4. The voltage controlled oscillator of claim 1, wherein the second resonance is at a frequency approximately three times a frequency of the first resonance.

5. The voltage controlled oscillator of claim 1, wherein the tank circuit further has a third resonance at a fifth harmonic.

6. The voltage controlled oscillator of claim 1, wherein the tank circuit comprises:
- a first metal line that is used to fabricate a first inductor;
- a second metal line that is used to fabricate a second inductor, wherein the second metal line resides within a boundary defined by the first metal line.

7. The voltage controlled oscillator of claim 6, wherein the first metal line and the second metal line form two concentric rings.

8. An electronic oscillator comprising:
- a plurality of active devices; and
- a tuned resonant circuit coupled to the plurality of active devices, wherein the tuned resonant circuit is comprised of an order greater than two and an output oscillating signal has a waveform that is non-sinusoidal,
- and wherein the tuned resonant circuit is comprised of a first inductor coupled in parallel with a first capacitor and in parallel with a second inductor in series with a second capacitor and in parallel with a third inductor in series with a third capacitor wherein said first inductor, said first capacitor, said second inductor in series with said second capacitor and said third inductor in series with said third capacitor share first and second nodes.

9. The electronic oscillator of claim 8, wherein an output signal is more squared than a sinusoidal waveform.

10. The electronic oscillator of claim 8, wherein the tuned resonant circuit has a first resonance at a first harmonic and a second resonance at a third harmonic for minimizing phase noise.

11. The electronic oscillator of claim 10, wherein the second resonance is at a frequency approximately three times a frequency of the first resonance.

12. The electronic oscillator of claim 8, wherein the tuned resonant circuit further has a third resonance at a fifth harmonic.

13. The electronic oscillator of claim 8, wherein the tuned resonant circuit comprises:
- a first metal line that is used to fabricate a first inductor;
- a second metal line that is used to fabricate a second inductor, wherein the second metal line resides within a boundary defined by the first metal line.

14. The electronic oscillator of claim 13, wherein the first metal line and the second metal line form two concentric rings.

15. A semiconductor chip comprising:
- a buffer;
- an amplifier coupled to the buffer; and
- a voltage controlled oscillator coupled to the amplifier, wherein the voltage controlled oscillator comprises:
  - a first metal line corresponding to a first inductor; and
  - a second metal line corresponding to a second inductor, wherein the second metal line resides within a boundary defined by the first metal line,
- wherein the first inductor is coupled in parallel with a first capacitor and in parallel with the second inductor in series with a second capacitor and in parallel with a third inductor in series with a third capacitor wherein said first inductor, said first capacitor, said second inductor in series with said second capacitor and said third inductor in series with said third capacitor share first and second nodes.

16. The semiconductor chip of claim 15, wherein the first metal line and the second metal line form two concentric loops.

17. The semiconductor chip of claim 15, wherein the voltage controlled oscillator includes a resonant circuit having an order greater than two.

18. The semiconductor chip of claim 15, wherein the voltage controlled oscillator includes a tank circuit having at least two odd harmonics.

19. The semiconductor chip of claim 15, wherein the voltage controlled oscillator outputs an oscillating waveform that is non-sinusoidal and has less phase noise than a sinusoidal waveform.

* * * * *